United States Patent
Murata et al.

(10) Patent No.: US 10,026,670 B1
(45) Date of Patent: Jul. 17, 2018

(54) POWER MODULE

(71) Applicant: Mitsubishi Electric Corporation, Tokyo (JP)

(72) Inventors: Daisuke Murata, Tokyo (JP); Hiroshi Yoshida, Tokyo (JP); Hidetoshi Ishibashi, Tokyo (JP)

(73) Assignee: Mitsubishi Electric Corporation, Tokyo (JP)

(*) Notice: Subject to any disclaimer, the term of this patent is extended or adjusted under 35 U.S.C. 154(b) by 0 days.

(21) Appl. No.: 15/790,090

(22) Filed: Oct. 23, 2017

(30) Foreign Application Priority Data

Mar. 2, 2017 (JP) ................................. 2017-038878

(51) Int. Cl.
*H01L 23/535* (2006.01)
*H01L 23/367* (2006.01)
*H01L 25/065* (2006.01)

(52) U.S. Cl.
CPC .......... *H01L 23/367* (2013.01); *H01L 25/065* (2013.01)

(58) Field of Classification Search
CPC .............. H01L 23/055; H01L 23/3107; H01L 23/3114; H01L 23/367; H01L 23/52; H01L 23/535; H01L 23/538; H01L 23/5384; H01L 23/5389
See application file for complete search history.

(56) References Cited

U.S. PATENT DOCUMENTS

| | | | | |
|---|---|---|---|---|
| 5,414,592 A * | 5/1995 | Stout | ................... | H05K 7/1404 165/80.3 |
| 5,483,420 A * | 1/1996 | Schiavini | ............ | H05K 7/1404 211/41.17 |
| 5,859,764 A * | 1/1999 | Davis | .................. | H05K 7/1404 165/80.3 |
| 5,949,650 A * | 9/1999 | Bulante | ................. | H05K 1/056 165/185 |
| 5,999,407 A * | 12/1999 | Meschter | ........... | H01L 23/4338 165/185 |
| 6,205,023 B1 * | 3/2001 | Moribe | ............. | H05K 7/20436 165/185 |
| 6,246,582 B1 * | 6/2001 | Habing | ............... | H05K 7/1404 257/727 |

(Continued)

FOREIGN PATENT DOCUMENTS

| JP | 2013-021371 A | | 1/2013 |
|---|---|---|---|
| JP | 2013021371 A | * | 1/2013 |

(Continued)

*Primary Examiner* — Earl Taylor
(74) *Attorney, Agent, or Firm* — Studebaker & Brackett PC

(57) ABSTRACT

A power module includes: a relay substrate including a first conductor layer provided on a front surface and a second conductor layer provided on a back surface; copper blocks provided in holes penetrating through the relay substrate in a thickness direction and connecting the first conductor layer to the second conductor layer; semiconductor devices wherein each semiconductor device includes a main electrode provided at a location facing an end face of the corresponding copper block and only one copper block is electrically connected to one main electrode; an insulating substrate connected to back-surfaces of the semiconductor devices via joining materials; and a sealer sealing the relay substrate, the copper blocks, and the semiconductor devices.

5 Claims, 5 Drawing Sheets

(56) References Cited

U.S. PATENT DOCUMENTS

| | | | | |
|---|---|---|---|---|
| 6,771,504 B2 * | 8/2004 | Barcley | H05K 7/1404 | 165/185 |
| 6,873,528 B2 * | 3/2005 | Hulan | H05K 7/20545 | 174/16.3 |
| 6,982,877 B2 * | 1/2006 | Vinson | G06F 1/20 | 165/185 |
| 7,349,221 B2 * | 3/2008 | Yurko | H05K 7/1404 | 165/80.2 |
| 7,514,777 B2 * | 4/2009 | Kawaguchi | H01L 23/5385 | 257/678 |
| 7,557,442 B2 * | 7/2009 | Licht | H01L 23/3675 | 257/675 |
| 8,039,962 B2 * | 10/2011 | Lee | H01L 21/76898 | 257/750 |
| 8,223,494 B2 * | 7/2012 | Bult | H05K 7/20672 | 165/104.33 |
| 9,418,930 B2 * | 8/2016 | Stahr | H01L 23/36 | |
| 9,515,061 B2 * | 12/2016 | Inokuchi | H01L 25/18 | |
| 9,704,768 B2 * | 7/2017 | Kawaguchi | H01L 23/18 | |
| 9,871,463 B2 * | 1/2018 | Lai | H02M 7/003 | |
| 9,875,952 B2 * | 1/2018 | Okamoto | H01L 23/3675 | |
| 9,881,879 B2 * | 1/2018 | Inaba | H01L 23/562 | |
| 2002/0117743 A1 * | 8/2002 | Nakatani | H01L 21/4857 | 257/687 |
| 2004/0061221 A1 * | 4/2004 | Schaffer | H01L 24/40 | 257/723 |
| 2006/0109631 A1 * | 5/2006 | Marro | H05K 7/1404 | 361/718 |
| 2007/0274047 A1 * | 11/2007 | Nagase | H01L 23/3735 | 361/704 |
| 2008/0054425 A1 * | 3/2008 | Malhan | H01L 24/72 | 257/678 |
| 2008/0054439 A1 * | 3/2008 | Malhan | H01L 23/49844 | 257/690 |
| 2008/0291688 A1 * | 11/2008 | Higashi | F21V 29/004 | 362/516 |
| 2009/0095979 A1 * | 4/2009 | Saito | H01L 25/18 | 257/177 |
| 2009/0246910 A1 * | 10/2009 | Taniguchi | H01L 23/5385 | 438/107 |
| 2010/0013085 A1 * | 1/2010 | Oi | H01L 23/3121 | 257/693 |
| 2010/0127371 A1 * | 5/2010 | Tschirbs | H01L 23/13 | 257/684 |
| 2011/0133333 A1 * | 6/2011 | Kwon | H01L 21/76898 | 257/737 |
| 2011/0249407 A1 * | 10/2011 | Kawaguchi | H01L 23/053 | 361/719 |
| 2011/0304989 A1 * | 12/2011 | Ootomo | H05K 7/1404 | 361/704 |
| 2012/0038033 A1 * | 2/2012 | Oga | H01L 21/565 | 257/659 |
| 2012/0106086 A1 * | 5/2012 | Schloerke | H01L 25/072 | 361/715 |
| 2012/0241953 A1 * | 9/2012 | Yamada | H01L 23/4334 | 257/737 |
| 2013/0207241 A1 * | 8/2013 | Lee | H01L 21/76898 | 257/621 |
| 2013/0207242 A1 * | 8/2013 | Lee | H01L 21/76898 | 257/621 |
| 2014/0138850 A1 * | 5/2014 | Takayama | H01L 24/29 | 257/774 |
| 2014/0151744 A1 * | 6/2014 | Lee | H01L 25/072 | 257/144 |
| 2014/0159225 A1 * | 6/2014 | Zushi | H01L 23/3735 | 257/690 |
| 2014/0239438 A1 * | 8/2014 | Kilger | H01L 21/82 | 257/528 |
| 2014/0367736 A1 * | 12/2014 | Iizuka | H01L 25/072 | 257/133 |
| 2015/0076570 A1 * | 3/2015 | Sunaga | H01L 25/07 | 257/288 |
| 2015/0084207 A1 * | 3/2015 | Chauhan | H01L 24/26 | 257/774 |
| 2015/0118391 A1 * | 4/2015 | Kilhenny | F21V 29/004 | 427/97.2 |
| 2015/0179551 A1 * | 6/2015 | Nakamura | H01L 25/072 | 257/773 |
| 2015/0289369 A1 * | 10/2015 | Sunaga | H01L 23/3735 | 361/783 |
| 2016/0014878 A1 * | 1/2016 | Kilhenny | H01L 23/142 | 257/99 |
| 2016/0035646 A1 * | 2/2016 | Soyano | H01L 23/36 | 257/692 |
| 2016/0172134 A1 * | 6/2016 | Watari | F02N 11/087 | 361/820 |
| 2016/0172285 A1 * | 6/2016 | Yang | H01L 25/072 | 257/675 |
| 2016/0295682 A1 * | 10/2016 | Tashima | H05K 1/0209 | |
| 2016/0300770 A1 * | 10/2016 | Taya | H01L 23/053 | |
| 2016/0351478 A1 * | 12/2016 | Lai | H01L 23/5389 | |
| 2016/0352246 A1 * | 12/2016 | Lai | H02M 7/003 | |
| 2017/0018524 A1 * | 1/2017 | Nashida | H01L 24/29 | |
| 2017/0053871 A1 * | 2/2017 | Nakajima | H01L 24/24 | |
| 2017/0064808 A1 * | 3/2017 | Rizza | H01L 23/24 | |
| 2017/0133308 A1 * | 5/2017 | Inaba | H01L 23/3121 | |
| 2018/0040593 A1 * | 2/2018 | Zhou | H01L 25/071 | |

FOREIGN PATENT DOCUMENTS

| | | | | |
|---|---|---|---|---|
| JP | 2014027324 A | * | 2/2014 | H01L 24/18 |
| JP | 2014199955 A | * | 10/2014 | H01L 24/01 |

* cited by examiner

POWER MODULE

BACKGROUND OF THE INVENTION

Field

The present invention relates to a structure of a power module.

Background

In recent years, there is a demand for small power modules in the fields of vehicles, industrial machines, or equipment for consumer use. A technique that enables miniaturization by using a relay substrate in which conductor layers do not have a single-layer structure, but instead have a layered structure, has been proposed. For example, Patent Literature 1 (JP 2013-21371 A) discloses a structure for causing a current to flow using a relay substrate, which makes it possible to provide a power module smaller than that having a single-layer structure.

SUMMARY

However, in a semiconductor device disclosed in Patent Literature 1, semiconductor devices are respectively connected to a plurality of conductive posts and the plurality of conductive posts are respectively connected to through-holes. When a split flow ratio varies due to variations in the contact resistance between the semiconductor devices and the plurality of conductive posts and between the plurality of conductive posts and the through-holes, a variation in the magnitude of the current flowing through the conductive posts occurs and the current-carrying capability of the conductive posts through which a maximum current flows becomes insufficient, which causes a problem that the magnitude of the entire current is limited.

The present invention has been made to solve the above-mentioned problem, and an object of the present invention is to provide a power module that prevents the occurrence of variations in the magnitude of a current flowing through each conductive post due to a difference in split flow ratio.

According to the present invention, a power module includes: a relay substrate including a first conductor layer provided on a front surface and a second conductor layer provided on a back surface; copper blocks provided in holes penetrating through the relay substrate in a thickness direction and connecting the first conductor layer to the second conductor layer; semiconductor devices wherein each semiconductor device includes a main electrode provided at a location facing an end face of the corresponding copper block and only one copper block is electrically connected to one main electrode; an insulating substrate connected to back-surfaces of the semiconductor devices via joining materials; and a sealer sealing the relay substrate, the copper blocks, and the semiconductor devices.

The power module according to the present invention has a configuration in which each semiconductor device and the relay substrate are connected through a single copper block. This configuration provides an advantageous effect of preventing the occurrence of variations in the magnitude of the current flowing through each copper block due to a difference in split flow ratio.

Other and further objects, features and advantages of the invention will appear more fully from the following description.

DESCRIPTION OF EMBODIMENTS

First Embodiment

Figure 1:
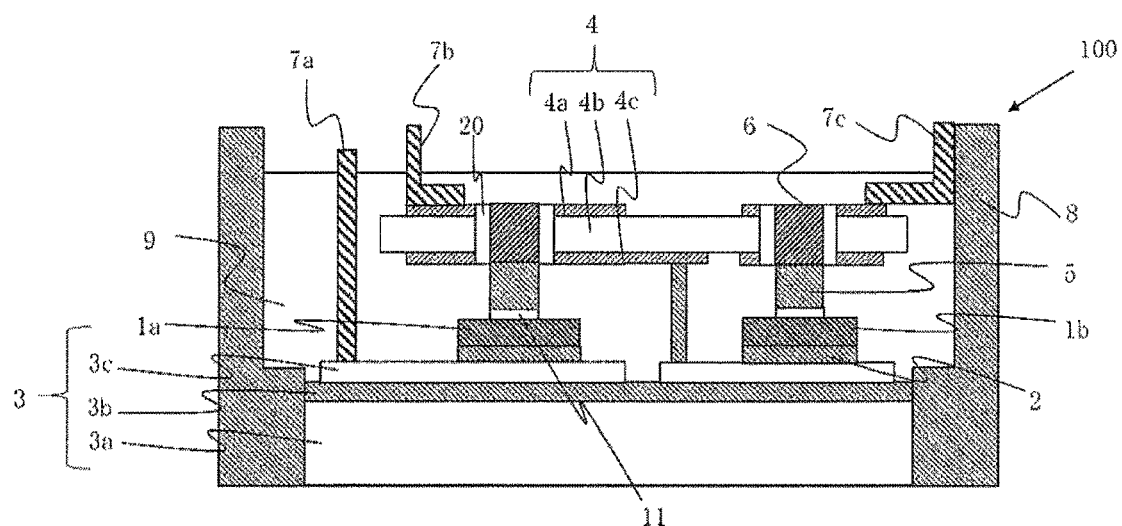
FIG. 1 is a sectional view illustrating the power module according to the first embodiment.

A power module according to a first embodiment will be described. FIG. 1 is a sectional view illustrating the power module according to the first embodiment. Note that in the figures other than FIG. 1, the same reference numerals denote the same or corresponding parts. A power module 100 has a configuration in which semiconductor devices 1 (1a, 1b) are joined to the front surface of an insulating substrate 3 through solder 2 and a relay substrate 4 is disposed above the front surface of the insulating substrate 3 and electrically connected to the semiconductor devices 1 through copper blocks 6.

In the power module shown in FIG. 1, the semiconductor devices 1 are IGBTs each serving as a switching device, and are joined to the front surface of a circuit pattern 3c through the solder 2. MOSFETs, diodes, or the like other than IGBTs may be used as the semiconductor devices.

The insulating substrate 3 includes a base plate 3a, an insulating layer 3b, and a circuit pattern 3c. The base plate 3a and the circuit pattern 3c are each formed of, for example, copper. The insulating layer 3b may be formed of, for example, an inorganic ceramic material, or a material in which ceramic powder is dispersed in a thermosetting resin such as an epoxy resin. A back-surface electrode of each semiconductor device 1, which is a collector electrode if the semiconductor device is an IGBT, is connected to the insulating substrate 3 through the solder, thereby ensuring the electric insulation on the outside of the power module 100.

The relay substrate 4 includes an insulating plate 4b, a front-surface conductor layer 4a, which is a first conductor layer formed on the front surface of the insulating plate 4b, and a back-surface conductor layer 4c, which is a second conductor layer formed on the back surface of the insulating plate 4b. For example, both surfaces of the insulating plate formed of a glass epoxy substrate are provided with a conductive member having a thickness equal to or greater than 0.2 mm. Note that the relay substrate 4 can be modified in various ways, as long as three-dimensional wiring is implemented. For example, the degree of freedom of wiring may be increased by using conductors having three or more layers in the relay substrate. In this case, two or more insulating plates are prepared and each of the insulating plates is sandwiched between conductors, thereby forming the relay substrate formed of conductors having three or more layers.

Figure 2:
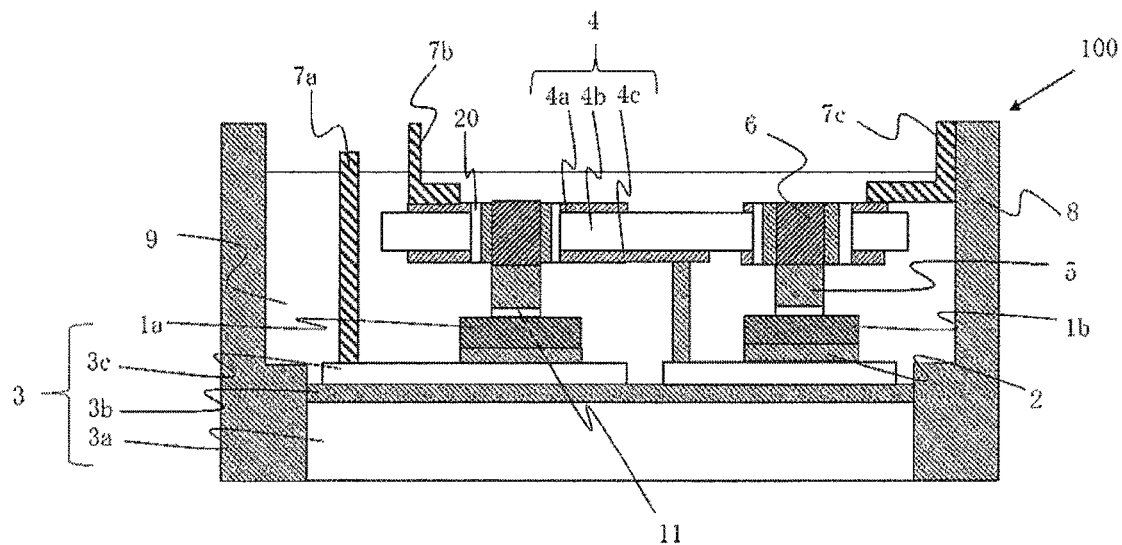
FIG. 2 is a sectional view illustrating the power module wherein each copper block is soldered to the relay substrate.

The relay substrate 4 is provided with a hole penetrating through the relay substrate in the thickness direction thereof. A connecting part 20 that connects the conductor layers formed on the both surfaces of the insulating plate 4b is formed in the hole. The connecting part 20 is not particularly limited, as long as the connecting part electrically connects the conductor layers formed on the both surfaces of the insulating plate 4b. For example, the connecting part 20 is a copper plating layer. Each copper block 6 is pressure-welded to the connecting part 20, thereby ensuring a conduction area between the semiconductor devices 1 and the relay substrate 4. A main electrode 11 of each semiconductor device 1 is provided at a location facing an end face of the corresponding copper block 6. The main electrode 11 of each semiconductor device 1 and the back surface of the corresponding copper block 6 are electrically connected through the solder. In this case, only one copper block 6 is electrically connected to one main electrode 11. That is, the copper blocks and the main electrodes are connected in a one-to-one correspondence. Note that as illustrated in FIG. 2, the part to which each copper block 6 is pressure-welded and the connecting part 20 are soldered to firmly connect each copper block 6 with the relay substrate 4, thereby improving the current-carrying effect.

An external terminal 7a is electrically connected to the circuit pattern 3c and is used to exchange an electric signal with an external device. Note that the external terminal 7a may be subjected to insert molding in a case 8. Further, the external terminal 7a may be formed so as to penetrate through the relay substrate. In this case, at least one through-hole through which an external electrode is caused to penetrate may be formed at a predetermined position on the relay substrate.

Figure 3:
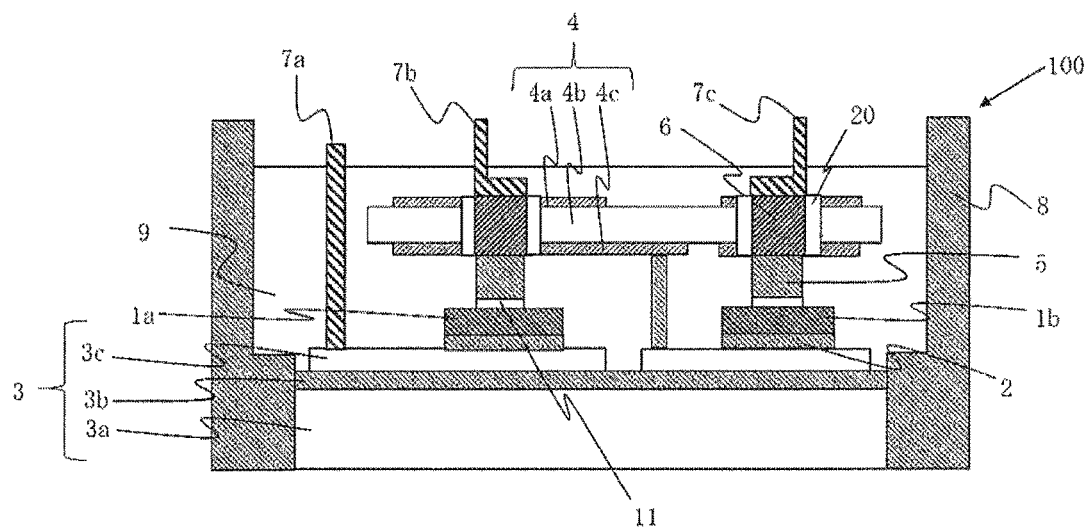
FIG. 3 is a sectional view illustrating the power module wherein the external terminals are joined to the copper blocks.

External terminals 7b and 7c are electrically connected to the front-surface conductor layer 4a of the relay substrate 4 and are used to exchange an electric signal with an external device. FIG. 1 illustrates that the external terminals 7b and 7c have an L-shape, but the external terminals 7b and 7c may have a cylindrical shape. As illustrated in FIG. 3, the external terminals 7b and 7c may be joined to the copper blocks 6, instead of being joined to the front-surface conductor layer 4a of the relay substrate 4.

The insulating substrate 3, the semiconductor devices 1, and the relay substrate 4 are surrounded by the case 8. The case 8 is formed of a plastic resin or the like. A sealer 9 is filled in the case 8. The sealer 9 is not particularly limited, as long as a material having insulating properties is used. For example, an epoxy resin is used. The copper blocks, the relay substrate 4, and the semiconductor devices 1 are surrounded by the sealer 9. A part of the external terminals is covered with the sealer 9, while a part of the terminals extends to the outside of the sealer 9 so as to exchange signals with an external device. Further, the back surface of the insulating substrate 3 is exposed from the sealer 9 and is cooled by a heat sink (not illustrated).

Referring to FIG. 1, a circuit configuration in which the semiconductor devices are IGBTs will be described. The semiconductor device 1a and the semiconductor device 1b are connected in series, and diodes are respectively connected in parallel (not illustrated) with the semiconductor devices, thereby forming an inverter circuit. The external terminal 7a serves as a P terminal which is a main terminal of the power module, and is electrically connected to the collector electrode which is a back-surface electrode of the semiconductor device 1a. An emitter electrode, which is a front-surface electrode (main electrode 11) of the semiconductor device 1a, is connected to the external terminal 7b through a single copper block. The external terminal 7b serves as an output terminal. The external terminal 7b is electrically connected to the collector electrode of the semiconductor device 1b. The emitter electrode of the semiconductor device 1b is connected to the external terminal 7c through a single copper block. The external terminal 7c serves as an N terminal which is a main terminal of the power module. As a matter of course, circuit configurations other than the circuit configuration described above may be employed.

The power module according to the first embodiment has a configuration in which each semiconductor device and the relay substrate are connected to a single main electrode through a single copper block. This configuration provides an advantageous effect of preventing the occurrence of variations in the magnitude of the current flowing through each copper block due to a difference in split flow ratio. In the case of using a plurality of copper blocks, instead of using a single copper block, there is a need to set an interval between the plurality of copper blocks. However, the use of a single copper block eliminates the need for setting a certain interval between copper blocks, and provides an advantageous effect of miniaturizing the power module. Further, each semiconductor device and the relay substrate are connected to a single main electrode through a single copper block, thereby eliminating the need for setting an interval between copper blocks, unlike in the case of using a plurality of copper blocks. This configuration provides an advantageous effect that members having a large heat capacity can be joined and the radiation performance can be improved within a transient time range.

Second Embodiment

Figure 4:
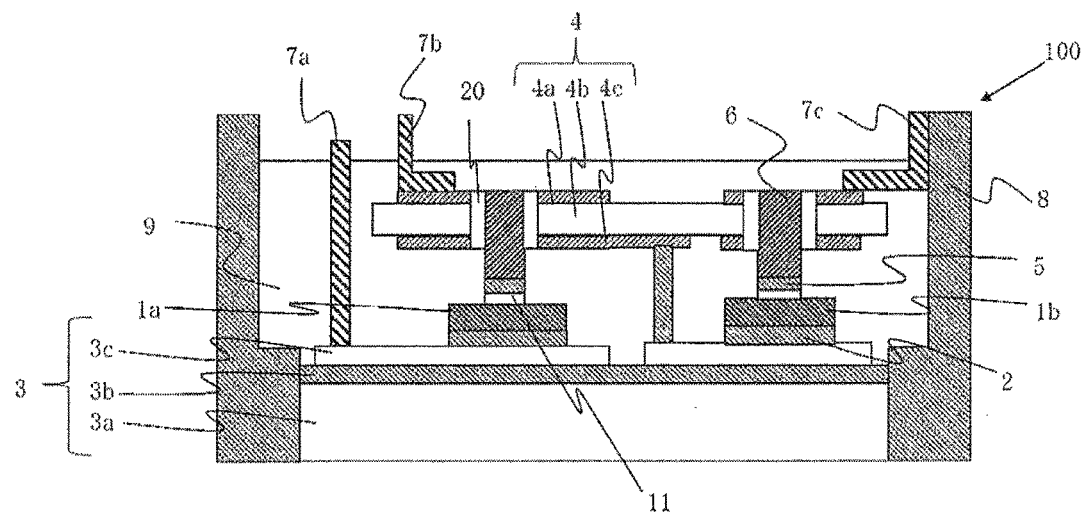
FIG. 4 is a sectional view illustrating the power module according to the second embodiment.

A power module according to a second embodiment will be described. FIG. 4 is a sectional view illustrating the power module according to the second embodiment. In the power module according to the second embodiment, the back surface of each copper block 6 is located so as to project below the back surface of the relay substrate 4.

Figure 5:
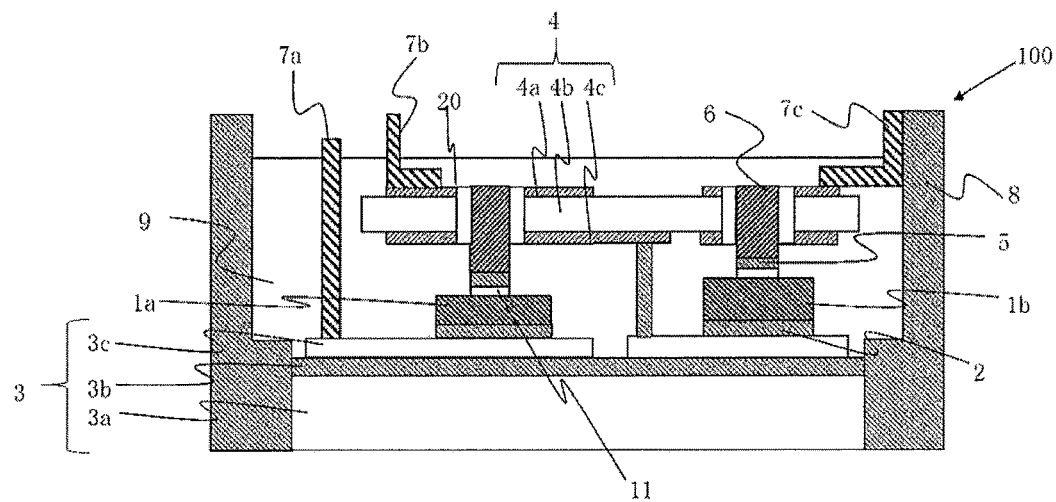
FIG. 5 is a sectional view illustrating the power module wherein the semiconductor devices have different thicknesses.

The power module according to the second embodiment has a configuration in which the back surface of each copper block 6 is located so as to project below the back surface of the relay substrate 4. This configuration provides an advantageous effect of facilitating the adjustment of the thickness of the solder used for joining the copper blocks 6 and the semiconductor devices 1 together. Further, as illustrated in FIG. 5, even when the semiconductor devices 1 have different thicknesses, the thickness of the solder can be optimized, while preventing the relay substrate from being inclined, by adjusting the height of each copper block 6.

Third Embodiment

Figure 6:
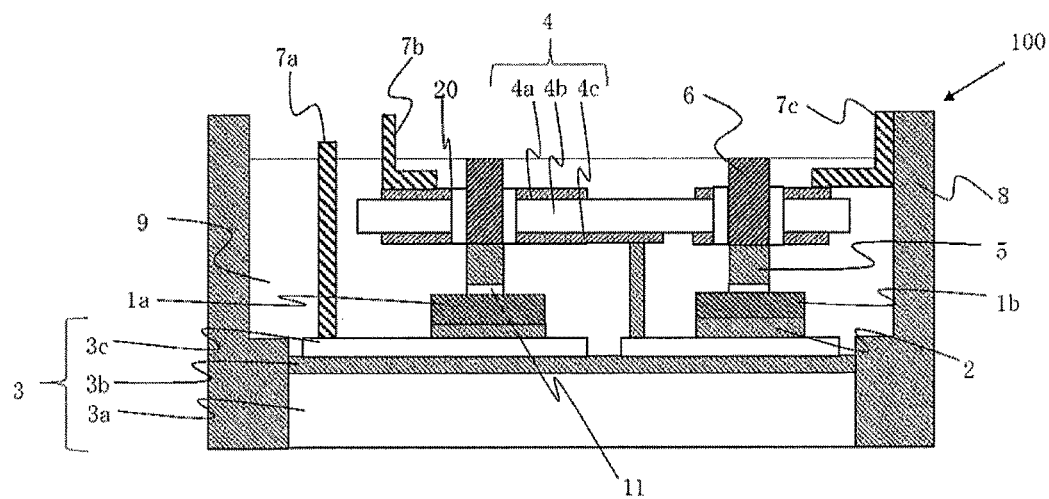
FIG. 6 is a sectional view illustrating the power module according to the third embodiment.

A power module according to a third embodiment will be described. FIG. 6 is a sectional view illustrating the power module according to the third embodiment. In the power module according to the third embodiment, the front surface of each copper block 6 is located so as to project above the front surface of the relay substrate 4 and the front surface of each copper block 6 is exposed from the sealer 9.

Figure 7:
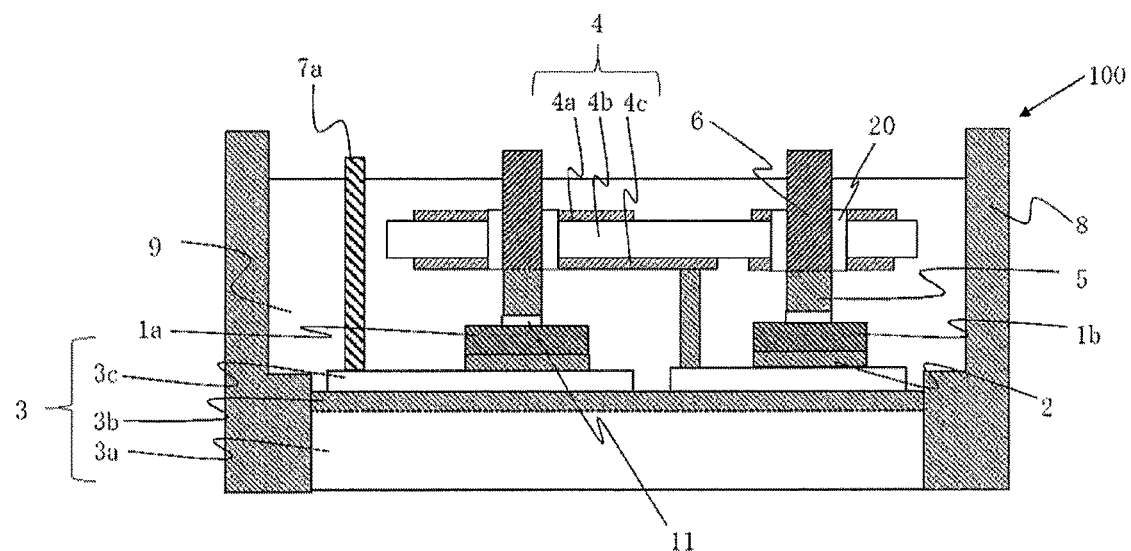
FIG. 7 is a sectional view illustrating the power module wherein each copper block is exposed to the outside of the sealer.
Figure 8:
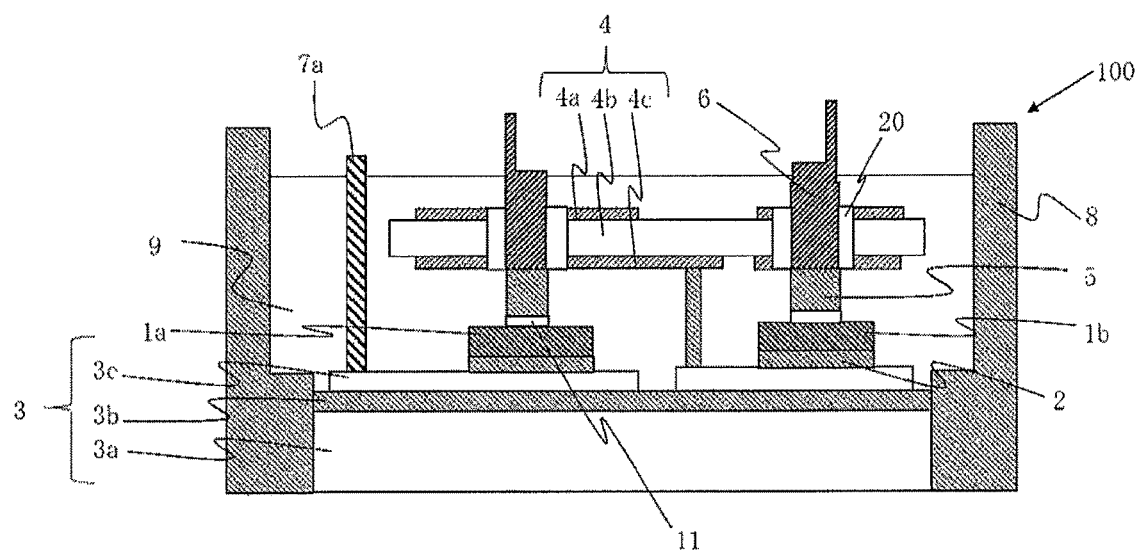
FIG. 8 is a sectional view illustrating the power module wherein the exposed part of each copper block has a terminal shape.

In the power module according to the third embodiment, the front surface of each copper block 6 is located so as to project above the front surface of the relay substrate 4 and the front surface of each copper block 6 is exposed from the sealer 9, thereby making it possible to heat each copper block 6 from the part where the copper block is exposed. This configuration provides an advantageous effect of facilitating soldering between the copper blocks 6 and the semiconductor devices 1 from the outside of the power module. As illustrated in FIG. 7, each copper block 6 that is exposed to the outside of the sealer 9 may be used as an external electrode. Further, as illustrated in FIG. 8, the exposed part of each copper block has a terminal shape, which facilitates the connection of each copper block to an external component.

Fourth Embodiment

Figure 9:
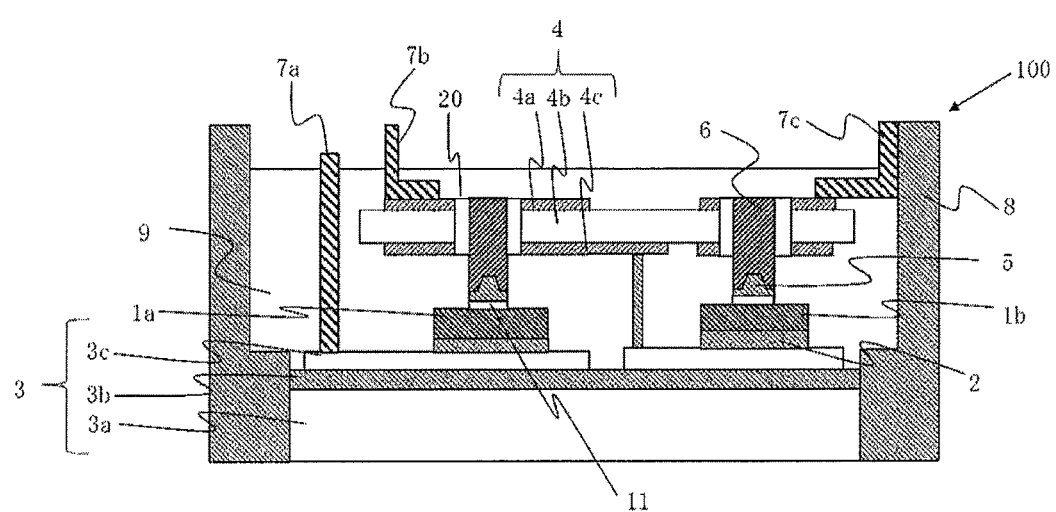
FIG. 9 is a sectional view illustrating the power module according to the fourth embodiment.

A power module according to a fourth embodiment will be described. FIG. 9 is a sectional view illustrating the power module according to the fourth embodiment. The power module according to the fourth embodiment has a recess formed in the back surface of each copper block 6.

In the power module according to the fourth embodiment, the back surface of each copper block 6 has a recess, which provides an advantageous effect of preventing the solder used for joining the copper blocks 6 and the semiconductor devices 1 together from protruding. FIG. 9 illustrates that the recess has a trapezoidal shape. However, the recess may have a rectangular shape, a square shape, a triangular shape, or a semicircular shape. A plurality of recesses may be formed.

Note that the present invention includes arbitrary combinations of embodiments and modified examples, and also includes modifications or omissions which can be made, as needed, to the embodiments, within the scope of the invention.

Further, means for joining the components is not limited to solder, and any conductive joining material can be used. As the conductive joining material, a metal having a low electric resistance, such as solder, a metallic paste using a metal filler, or a sintered metal which is metallized by heat, is preferably used.

Obviously many modifications and variations of the present invention are possible in the light of the above teachings. It is therefore to be understood that within the scope of the appended claims the invention may be practiced otherwise than as specifically described.

The entire disclosure of Japanese Patent Application No. 2017-038878, filed on Mar. 2, 2017 including specification, claims, drawings and summary, on which the Convention priority of the present application is based, is incorporated herein by reference in its entirety.

The invention claimed is:

1. A power module comprising:
    a relay substrate including a first conductor layer provided on a front surface and a second conductor layer provided on a back surface;
    copper blocks provided in holes penetrating through the relay substrate in a thickness direction and connecting the first conductor layer to the second conductor layer;
    semiconductor devices wherein each semiconductor device includes a main electrode provided at a location facing an end face of the corresponding copper block and only one copper block is electrically connected to one main electrode;
    an insulating substrate connected to back-surfaces of the semiconductor devices via joining materials; and
    a sealer sealing the relay substrate, the copper blocks, and the semiconductor devices.

2. The power module according to claim 1, wherein the second conductor layer faces the semiconductor device, and the end face of the copper block facing the main electrode projects from the second conductor layer.

3. The power module according to claim 1, wherein an end part of the copper block is exposed from the sealer.

4. The power module according to claim 3, wherein the end part of the copper block exposed from the sealer has a terminal shape.

5. The power module according to claim 1, wherein the end face of the copper block facing the main electrode has a recess.

* * * * *